United States Patent [19]

Fraleux et al.

[11] Patent Number: 4,486,767
[45] Date of Patent: Dec. 4, 1984

[54] BIPOLAR ELEMENT HAVING A NON-LINEAR CONDUCTIVITY CHARACTERISTIC, AND COMMUTATING DEVICE INCORPORATING THE SAME

[75] Inventors: Jean Fraleux; Jean L. Ploix, both of Paris, France

[73] Assignee: Thomson-CSF, Paris, France

[21] Appl. No.: 269,767

[22] Filed: Jun. 3, 1981

[30] Foreign Application Priority Data

Jun. 6, 1980 [FR] France .................. 80 12596

[51] Int. Cl.³ .............................. H01L 29/78
[52] U.S. Cl. ........................ 357/23; 357/4; 357/45; 357/65; 357/68; 350/334
[58] Field of Search ............ 357/23 MG, 23 VT, 45, 357/65, 68, 22 G, 22 LA, 23 TF, 23 R, 4, 15, 41; 350/334; 307/304, 548, 550, 568

[56] References Cited

U.S. PATENT DOCUMENTS

| 3,774,989 | 11/1973 | Takahashi | 357/45 X |
| 4,065,781 | 12/1977 | Gutknecht | 357/16 X |
| 4,112,333 | 9/1978 | Asars et al. | 350/334 X |
| 4,204,217 | 5/1980 | Goodman | 357/23 TF |

FOREIGN PATENT DOCUMENTS

| 1425906 | 12/1966 | France . | |
| 54-101285 | 8/1979 | Japan | 357/68 |

OTHER PUBLICATIONS

F. F. Fang, "TFT Structure with Electronically Adjustable Threshold", *IBM Technical Disclosure Bulletin*, vol. 20, (1978), p. 5352.

R. G. Wagger et al., "A Dual Offset Gate Thin-Film Transistor", Proceedings of the IEEE, vol. 55, Jul. 1967, pp. 1217-1218.

F. Morin, "DES Transistors en Couches Minces Pour les Ecrans de Visualisation", Electronique et Applications Industrielles, No. 251, Jun. 1, 1978, (Paris), pp. 15-16.

G. Kramer, "Thin-Film-Transistor Switching Matrix for Lat-Panel Display", IEEE Transactions on Electron Devices, vol. ED-22, No. 9, Sep. 1975, (New York, USA), pp. 733-739.

B. D. Chase et al., "Materials Analysis of Thin Film Transistors", Thin Solid Films, vol. 67, Apr. 1980, (Lausanne CH), pp. 207-228.

*Primary Examiner*—Andrew J. James
*Assistant Examiner*—J. Carroll
*Attorney, Agent, or Firm*—Roland Plottel

[57] ABSTRACT

A bipolar element having a non-linear conductivity characteristic is constituted by a semiconductor body placed between two dielectric layers, a source electrode, a drain electrode and a grid electrode. The grid electrode is constituted by a first grid electrode part electrically connected to the drain electrode and a second grid electrode part electrically connected to the source electrode. This bipolar element is adapted to be used as a commutating component, especially in visualization or display devices.

8 Claims, 5 Drawing Figures

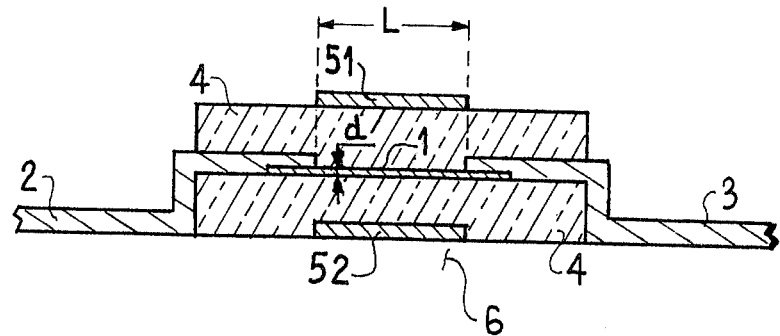
FIG_1 PRIOR ART
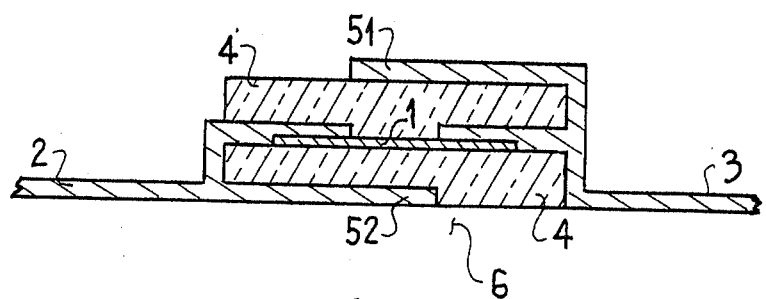
FIG_2
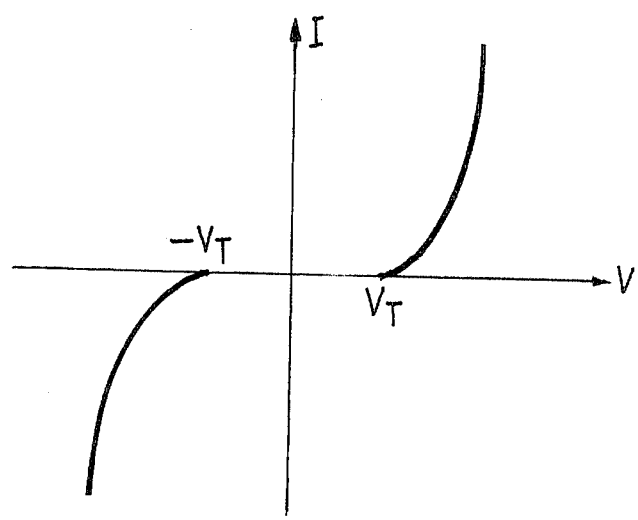
FIG_3

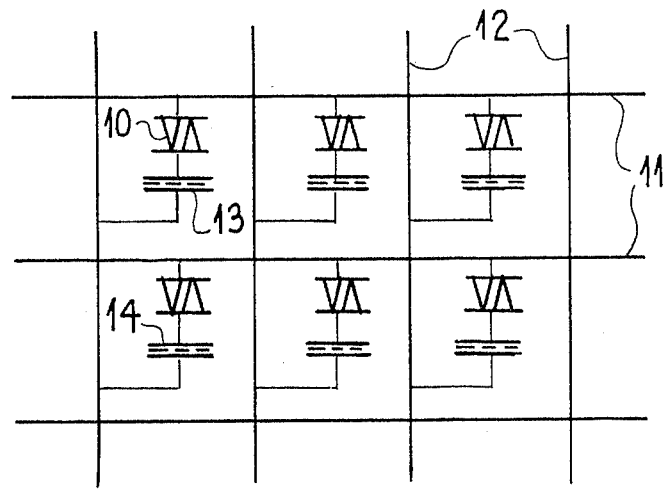
FIG_4-a
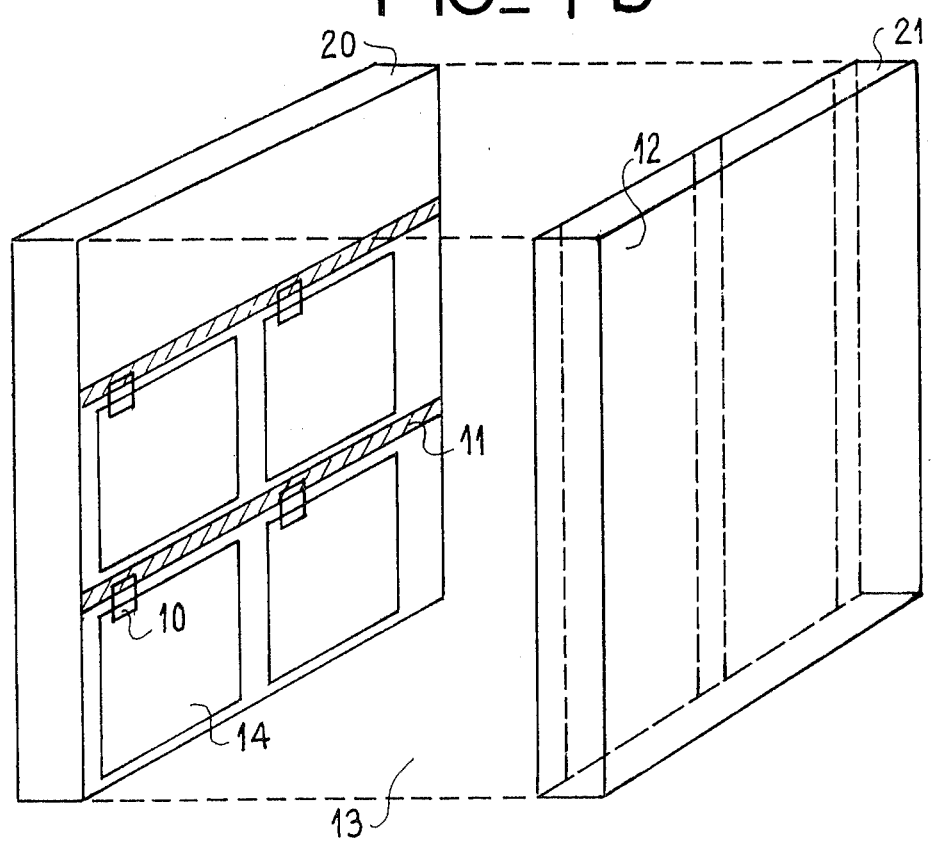
FIG_4-b

BIPOLAR ELEMENT HAVING A NON-LINEAR CONDUCTIVITY CHARACTERISTIC, AND COMMUTATING DEVICE INCORPORATING THE SAME

The present invention is related to a bipolar element having a non-linear conductivity characteristic.

The invention is also related to commutating devices, especially visualization commutating devices incorporating such elements.

Such devices may concern, for example, the addressing of display panels or the reading-out of large-size detection panels. Panels of this kind, the operating mode of which is well known by those skilled in the art, are produced by means of two planar parallel glass plates which are assembled so as to define between them an interval filled, for instance, with a liquid crystal. The commutating elements used in such devices are generally constituted by field effect transistors in the form of thin layers.

Certain problems are encountered, as regards realizing the connections between such transistors and the glass plates, due to the presence of a grid or gate of crossed electrodes on one of the surfaces.

The present invention is aimed at overcoming this drawback by substituting for the thin layer field effect transistors components of the same type which, however, comprise only two electrically independent electrodes instead of three electrodes. Due to this feature, the problems relating to the connections between the electrodes and the glass plates are substantially minimized.

The bipolar element according to the invention is constituted by a semiconductor body placed between two isolating layers, a source electrode and a drain electrode connected, at either side, to said semiconductor body, and a double grid electrode comprising a first conductive part applied onto one of said isolating layers and connected to the drain, and a second conductive part applied onto the other isolating layer and connected to the source, the assembly thus constituted being placed onto an isolating substrate on which it rests with the interposition of said grid electrode.

The bipolar element according to the invention differs from the field effect transistor known in the prior art in that it comprises only two electrically independent electrodes—the source and the drain—while the third electrode—the grid—is divided into two parts electrically connected respectively to the source and the drain.

The invention will be described herein-below in a more detailed manner with reference to the appended drawing which is given by way of illustration, but not of limitation.

In the drawing:

FIG. 1 is a diagrammatic sectional view showing a field effect transistor of the prior art.

FIG. 2 is a diagrammatic sectional view of a bipolar element according to the present invention.

FIG. 3 illustrates the I [V] characteristic of the bipolar element according to the invention.

FIG. 4a shows schematically a matrix-type display panel with liquid crystals, provided with components according to the present invention.

FIG. 4b shows an embodiment of a matrix-type display panel with liquid crystals, provided with components according to the present invention.

FIG. 1 shows, in section, a conventional field effect transistor of the type known in the prior art.

Such transistor comprises a semiconductor layer 1 placed on an isolating substrate 6 and disposed between two electrodes, to wit: a source electrode (or source) 2 and a drain electrode (or drain) 3. A third electrode, a gate or grid electrode, is isolated from the semiconductor layer by a dielectric layer 4. Said grid electrode (gate or grid) may be located (with reference to the drawing) below the semiconductor layer, or above the semiconductor layer, or be divided into two parts located, respectively, above said semiconductor later, as shown at 51, and below said layer, as shown at 52, said two parts of the grid being electrically connected to each other; this latter arrangement is illustrated in FIG. 1.

The operation of such transistor will be briefly described hereinbelow.

Let L, 1, d be the length, the width and the height, respectively, of the semiconductor channel, the width 1, not illustrated in the drawing, being measured in a direction perpendicular to the plane of the drawing;

Let $G_1$, $G_2$ represent the lower grid part and the upper grid part, respectively;

Let $V_{G1}$, $V_{G2}$, $V_D$ be the voltages applied, respectively, to $G_1$, $G_2$ and to the drain with respect to the source;

Let $V(x)$ be the potential existing at point x of the abscissa axis of the semiconductor channel, then $n_o$ being the density of the charge carriers in the equilibrium state in the semiconductor, and $C_i$ being the capacity per surface unit of one of the isolating layers, the charge carrier density at abscissa point x equals, in the case of a channel with electron conductivity:

$$n(x) = n_o + n(x)$$

where $$n(x) = -\frac{C_i}{dq}[2V(x) - (V_{G1} + V_{G2})]$$

The threshold voltage is defined by:

$$V_T = -\frac{qdn_o}{c_i}$$

It follows that:

$$n(x) = \frac{c_i}{qd}[(V_{G1} + V_{G2} - V_T - 2V(x)]$$

The conductivity at abscissa point x is thus defined as follows:

$$\sigma(x) = \frac{\mu c_i}{d}[(V_{G1} + V_{G2} - V_T) - 2V(x)]$$

wherein $\mu$ represents the mobility of the charge carriers. Consequently, the current I flowing through the transistor is:

$$I = 1d\,\sigma(x)\frac{dV}{dx}$$

wherefrom it follows that:

$$I = 1\mu C_i [(V_{G1} + V_{G2} - V_T) - 2V(x)] \frac{dV(x)}{dx}$$

Integrating this expression between x=o and x=L gives the following result:

$$I = \frac{1}{L} \mu C_i [(V_{G1} + V_{G2} - V_T)V_D - V_D^2]$$

This relation expresses the operation of the transistor in the nonsaturated state. When:

$$V_D > \frac{V_{G1} + V_{G2} - V_T}{2}$$

the transistor attains the saturated state. The current is then defined by:

$$I_{sat} = \frac{1}{L} \mu C_i \frac{(V_{G1} + V_{G2} - V_T)^2}{4}$$

FIG. 2 is a schematical sectional view of a bipolar element according to the invention.

The invention consists in modifying the thin layer double grid transistor structure described herein-above with reference to FIG. 1. The two grids are no longer electrically connected to each other, but are connected, respectively, to a source and a drain. Thus the potential of the upper grid 51 is equal to that of the drain 3.

In fact, the bipolar element according to the invention is constituted by a semiconductor body 1 interposed between two isolating layers 4, a source electrode 2, a drain electrode 3 and a double grid elecrode comprising a grid part 52 electrically connected to source 2, as well as a grid part 51 electrically connected to drain 3.

Semiconductor body 1 is constituted by the following materials: cadmium selenide CdSe, selenium Se, tellurium Te, lead sulphide PbS and silicon Si or amorphous hydrogenated silicon.

The isolating layers 4 have a thickness comprised between 50 nm and 500 nm.

Source and drain electrodes 2 and 3 are made of materials adapted to establish a satisfactory ohmic or resistive contact with semiconductor body or layer 1. Such materials are selected from the group of metals consisting of molybdenum Mo, chrome Cr, gold Au, indium In, copper Cu, silver Ag, cadmium Cd and alloys thereof.

The operating conditions of the bipolar element according to the invention are defined as follows:

$$V_{G1} = o$$

$$V_{G2} = V_D$$

When these conditions are introduced into the expressions defining the current in the normal and saturated state, such as calculated herein-above in relation to the prior art field effect transistor shown in FIG. 1, the following expressions defining the current in the normal and saturated state in relation to the bipolar element according to the invention are obtained.

Under normal operating conditions:

$$I = \frac{1}{L} \mu C_i (-V_T V_D)$$

In the saturated state:

$$I = \frac{1}{L} \mu C_i \frac{(V_D - V_T)^2}{4}$$

The most interesting conditions, as regards the component according to the invention, are prevailing when $V_T$ is positive. The non-saturated state is then physically impossible, since said state would correspond to a negative resistance characteristic.

FIG. 3 illustrates the characteristic I [V] of the bipolar element according to the invention.

The negative portion of said characteristic curve is deduced from the positive portion thereof on account of the symmetric construction of the component according to the invention.

Due to the pronouncedly non-linear nature of the characteristic of the component, the latter is adapted to be used as a commutating element. More particularly, by way of example, but not of limitation, such component may be used in a matrix-type display panel.

FIGS. 4a and 4b show an example of such application.

FIG. 4a is a diagrammatic view of a liquid crystal matrix-type display panel using components according to the instant invention.

FIG. 4b illustrates a practical embodiment of such liquid crystal matrix-type display incorporating components according to the invention.

As shown in FIG. 4a, such liquid crystal matrix-type display panel comprises a certain number of line electrodes 11, a certain number of column electrodes 12, and liquid crystal elements 13 the actuating electrodes 14 of which are connected in a series with commutating elements, i.e. with bipolar elements 10 according to the invention.

FIG. 4b illustrates a practical embodiment of such display panel, as well as its operating mode.

A panel of this kind comprises two planar parallel plates fixed to each other in such a way that they define between said panels an interval filled with liquid crystal matter.

A first one of said plates, indicated at 20, supports line electrodes 11, components 10 according to the invention and actuating electrodes 14 of the liquid crystal shown in its entirety at 13.

The second plate 21 supports transparent column electrodes 12.

Depending on the electro-optical effect of the liquid crystal used, the required elements known to those skilled in the art are added, such as alignment layer for aligning the liquid crystal on the plate surfaces, light polarizers, etc, such supplementary elements being not shown in the Figure.

The operating mode of such matrix-type display device comprising one non-linear element at each intersection of a line and a column is well known.

By way of example, but not of limitation, one example of operation, related to the display of binary information, will be described herein-below.

In this example, the addressing is effected line by line.

All the lines are brought successively, one by one, to a potential $V_1$, while all the remaining lines are maintained at zero potential. At the same time the columns are brought either to a potential $(-V_1/2)$ or to a potential $(V_1/2)$.

The potential differences between the lines and the columns, which can thus be observed on the matrix are the following:

$V_L = 0 \qquad V_C = \dfrac{V_1}{2} \qquad V_L - V_C = -\dfrac{V_1}{2}$ $V_L = 0 \qquad V_C = -\dfrac{V_1}{2} \qquad V_L - V_C = \dfrac{V_1}{2}$ $V_L = V_1 \qquad V_C = \dfrac{V_1}{2} \qquad V_L - V_C = \dfrac{V_1}{2}$ $V_L = V_1 \qquad V_C = -\dfrac{V_1}{2} \qquad V_L - V_C = \dfrac{3V_1}{2}$ When $V_1 = V_T$ and when referring to FIG. 3 showing the characteristic I(V) of the field effect transistor according to the invention, it can be seen that no current can flow in the first three cases, contrarily to the fourth case. When the condition just described prevails during a sufficiently long period of time the condensator constituted by the liquid crystal itself will build up a load under a voltage of $V_T/2$ which must be selected sufficiently high for the crystal to be able to be excited.

One of the possibilities offered by this device consists in reversing all the polarities for each row, due to the symmetry of the electric characteristics of the components.

Under such operating conditions the liquid crystal is excited by an alternative voltage, which considerably increases its lifetime.

The invention is not limited to the embodiments shown and described herein-above. Many modifications and variants may be envisaged by those skilled in the art within the limits of the spirit and scope of the invention as defined in the appended claims.

What is claimed is:

1. A bipolar element having a non-linear conductivity characteristic, constituted by a semiconductor body interposed between first and second isolating layers, a source electrode and a drain electrode connected on each side to said semiconductor body, and a double gate electrode comprising a first conductive part applied onto the first one of said isolating layers on the surface thereof which is opposed to the surface connected to said semiconductor body, said first gate electrode part being connected to said drain electrode, said double gate electrode further comprising a second conductive gate electrode part applied onto the second isolating layer on the surface thereof which is opposed to the surface connected to said semiconductor body, said second gate electrode part being connected to said source electrode, the entire assembly thus constituted being supported by an isolating substrate with the interposition of said gate electrode.

2. A bipolar element according to claim 1, wherein said isolating layers are constituted by two superimposed isolating blades the lateral edges of which are contained in a common plane, said source electrode being constituted by a first metallic strip applied onto said substrate and on one side of the first one of said isolating blades which rests on said substrate, and a second metallic strip extending between said first and second blades from the sides thereof, and a third metallic strip applied on the edge of said first blade over the entire height thereof, said drain electrode being constituted by a first metallic strip applied onto said substrate and on the opposite side of said first isolating blade, a second metallic strip extending between said two blades from the sides thereof, a third metallic strip applied onto said second isolating blade and extending from the side thereof, and a fourth metallic strip applied on said two blades over the entire height thereof, said first strip of the source electrode extending under said first isolating blade at most up to a location plumb with said second strip of the drain electrode, and said third strip of the drain electrode extending at most up to a location plumb with said second strip of the source electrode.

3. The bipolar element of claim 1, wherein the thickness of said isolating layers is comprised between 50 mm and 500 nm.

4. The bipolar element of claim 1, wherein said source electrode is made of molybdenum.

5. The bipolar element of claim 1, wherein said source electrode is made of chrome.

6. The bipolar element of claim 1, wherein said drain electrode is made of molybdenum.

7. The bipolar element of claim 1, wherein said drain electrode is made of chrome.

8. A matrix-type liquid crystal display panel, constituted by two planar parallel plates with a liquid crystal layer inserted therebetween, one group of line electrodes affixed to one of said plates, one group of column electrodes affixed to the other plate and disposed perpendicularly to said line electrodes, the points of intersection of two respective electrodes of said two groups defining liquid crystal cells the terminals of which are connected during operation to differential potentials through commutating components constituted each by a bipolar element having a non-linear conductivity characteristic, such as claimed in claim 1.

* * * * *